US008507959B2

(12) United States Patent
Huang et al.

(10) Patent No.: US 8,507,959 B2
(45) Date of Patent: Aug. 13, 2013

(54) COMBINED-SOURCE MOS TRANSISTOR WITH COMB-SHAPED GATE, AND METHOD FOR MANUFACTURING THE SAME

(75) Inventors: Ru Huang, Beijing (CN); Qianqian Huang, Beijing (CN); Zhan Zhan, Beijing (CN); Yangyuan Wang, Beijing (CN)

(73) Assignee: Peking University, Beijing (CN)

( * ) Notice: Subject to any disclaimer, the term of this patent is extended or adjusted under 35 U.S.C. 154(b) by 119 days.

(21) Appl. No.: 13/318,333

(22) PCT Filed: Apr. 1, 2011

(86) PCT No.: PCT/CN2011/072372
§ 371 (c)(1),
(2), (4) Date: Oct. 31, 2011

(87) PCT Pub. No.: WO2012/097543
PCT Pub. Date: Jul. 26, 2012

(65) Prior Publication Data
US 2012/0181585 A1 Jul. 19, 2012

(30) Foreign Application Priority Data

Jan. 19, 2011 (CN) .......................... 2011 1 0021444

(51) Int. Cl.
*H01L 29/76* (2006.01)
*H01L 21/00* (2006.01)
*H01L 21/336* (2006.01)

(52) U.S. Cl.
USPC ............ 257/288; 257/E21.409; 257/E29.255; 438/151; 438/197

(58) Field of Classification Search
USPC .................. 257/288, 327, 341, 343, 334, 27, 257/105, 402, 337, 202, 330–332; 438/270, 438/438/589, 259, 151, 303, 478, 294, 286, 438/289, 275
See application file for complete search history.

(56) References Cited

U.S. PATENT DOCUMENTS
2010/0032754 A1* 2/2010 Kawaguchi ................... 257/337

FOREIGN PATENT DOCUMENTS
CN  101651141 A  2/2010
CN  101719517 A  6/2010
CN  101771079 A  7/2010

*Primary Examiner* — Chuong A Luu
*Assistant Examiner* — Cory Eskridge
(74) *Attorney, Agent, or Firm* — Bozicevic, Field & Francis LLP; Bret E. Field

(57) ABSTRACT

The present invention discloses a combined-source MOS transistor with a Schottky Barrier and a comb-shaped gate structure, and a method for manufacturing the same. The combined-source MOS transistor includes: a control gate electrode layer, a gate dielectric layer, a semiconductor substrate, a highly-doped source region and a highly-doped drain region, wherein a Schottky source region is connected to a side of the highly-doped source region which is far from a channel, one end of the control gate extends to the highly-doped source region, the extended gate region is an extension gate in a form of a comb-shaped and the original control gate region is a main gate; an active region covered by the extension gate is also a channel region, and is a substrate material; the highly-doped source region which is formed by highly doping is located on both sides of each comb finger of the extension gate; and a Schottky junction is formed at a location where the Schottky source region and the channel under the extension gate are located. As compared with an existing MOSFET, in the invention, a higher turn-on current, a lower leakage current and a steeper subthreshold slope may be obtained under the same process condition and the same active region size.

10 Claims, 3 Drawing Sheets

COMBINED-SOURCE MOS TRANSISTOR WITH COMB-SHAPED GATE, AND METHOD FOR MANUFACTURING THE SAME

FIELD OF THE INVENTION

The present invention relates to a field of Field-Effect-Transistor (FET) logic devices and circuits in CMOS ultra-large-scale integrated (ULSI) circuits, and in particular, to a combined-source MOS transistor with a Schottky Barrier and a comb-shaped gate structure, and a method for manufacturing the same.

BACKGROUND OF THE INVENTION

As a size of a Metal-Oxide-Silicon Field Effect Transistor (MOSFET) becomes smaller and smaller, especially when a feature size of the device enters a nanometer scale, a negative influence of a short-channel effect of the device also becomes more and more apparent. A Drain-Induced Barrier lowering (DIBL) effect and a band-to-band tunneling effect make an off-state leakage current of the device larger and larger, and as a threshold voltage of the device lowers, a power consumption of the integrated circuit increases. Moreover, due to theoretically limited by KT/q, a subthreshold slope of the conventional MOSFET device cannot decrease as the device size reduces simultaneously, and a subthreshold leakage current rises continually as the threshold voltage lowers. In order to overcome more and more challenges faced by a nanometer-scale MOSFET, novel device structures and preparation methods have become focus of small-size devices.

Early in 1960s, Lepselter and Sze put forwards a Schottky Barrier MOSFET structure. A conventional doping is replaced by a metal or a silicide in a source and a drain, and a turn-on is realized by using a direct tunneling of carriers in the source. The Schottky Barrier MOSFET greatly lowers a source and drain parasitic resistance of the device and realizes an ultra-shallow junction of the source and drain, and its simple process requires a small heat budget, which provides a possible solution for a use of a high-K and metal gate material. However, a large off-state leakage current and a small on-state current of the Schottky junction greatly limit an application the Schottky Barrier MOSFET device. Moreover, as to a problem of the theoretic limit of 60 mv/dec for the MOSFET subthreshold slope, in recent years, researchers have put forwards a possible solution, that is, by using a Tunneling Field Effect Transistor (TFET). The TFET uses the gate to control the band-to-band tunneling of a reversed-biased P-I-N junction so as to realize the turn-on, and the leakage current is very small. The TFET has many excellent features such as a low leakage current, a low subthreshold slope, a low working voltage and a low power consumption. However, as limited by a source junction tunneling probability and a tunneling area, the TFET faces a problem of a low on-state current, just like the Schottky Barrier MOSFET. Patent (CN101719517A) discloses a Schottky tunneling transistor, which solves a problem of a source/drain self-alignment of a TFET device by using a Schottky junction in the source and drain. However, the problem of small on-state current is still to be solved.

SUMMARY OF THE INVENTION

It is an object of the present invention to provide a MOS transistor having a combined-source structure with low power consumption, by using a comb-shaped gate to combine a Schottky junction and a band-to-band tunneling mechanism, and a method for manufacturing the same. With a condition compatible with an existing CMOS process and the same active region area as a MOSFET, because the comb-shaped structure is used, a tunneling area can be greatly increased and a turn-on current of the device can be evidently improved. Moreover, by using a combination of the Schottky junction and the band-to-band tunneling mechanisms, a leakage current and a parasitic resistance is small, and thus, a good subthreshold features is exhibited.

Technical solutions of the invention are as follows:

A combined-source MOS transistor with a comb-shaped gate is characterized in that, comprising a control gate electrode layer, a gate dielectric layer, a semiconductor substrate, a highly-doped source region and a highly doped drain region, wherein a Schottky source region is connected to a side of the highly-doped source region which is far from a channel, one end of the control gate extends to the highly-doped source region and forms a comb-shaped structure, the extended gate region is an extension gate in a form of a comb shape and the original control gate region is a main gate; an active region covered by the extension gate is also a channel region, and is a substrate material; the highly-doped source region, which is formed by highly doping, is located on both sides of each comb finger of the extension gate; the Schottky source region is formed by a metal or a metal silicide and a Schottky junction (a metal semiconductor junction) is formed at a location where the Schottky source region and the channel under the extension gate are located. The highly-doped drain region is formed by highly-doped semiconductor material with a doping type which is opposite to that of the highly-doped source region and is located on a side of the control gate Which is not extended.

A width of each comb finger of the extension gate must be a value (a value may range from 1 μm to 2 μm according to different doping concentrations in the channel and the source region) which is small enough so that a built-in potential of the source junction on both sides of the extension gate may deplete the channel region under the extension gate. Thus, a static leakage current of the device may be decreased. A minimum interval between adjacent two comb fingers of the extension gate, which is generally less than 2 μm, depends on the photolithography precision; and preferably, the interval may range from 0.5 μm to 3 μm. The total number of the comb fingers, which generally ranges from 2 to 10, is determined according to a width of the active region, a width of each comb finger and an amount of a current intended to be improved. A sum of the widths of all the comb fingers and the widths between the combs must be less than an implanted width of the active region of the source region, so as to guarantee the extension gate to be half-surrounded by the source region, and to ensure a large tunneling area.

The extension gate occupies 1/10-5/10 of a length of the active region in a length direction, but does not exceed the edge of the active region of the source terminal, and the specific length is determined by an amount of the current to be increased.

The Schottky source region may also be a Schottky source region with dopant segregation, which is formed by using a Post-Silicide technology in which a silicide is first formed and then impurities are implanted into the silicide. For an n-type device, the implanted impurities are phosphorus, and for a p-type device, the implanted impurities are boron, and a implanted dosage ranges from 5e14- to 5e15.

A margin of 0.5-2 μm may be left between the main gate and the highly-doped drain region, in order to suppress a bipolar turn-on feature of the structure. Thus, the main gate region may be unable to control the device, so that a better subthreshold slope is obtained.

A method for manufacturing the combined-source MOS transistor with a Schottky junction and a comb-shaped gate comprises following steps:

(1) defining an active region on a semiconductor substrate via a shallow trench isolation;

(2) growing a gate dielectric layer;

(3) depositing a gate electrode layer, then performing photolithography and etching on the gate electrode layer to form patterns of a main gate and a comb-shaped extension gate;

(4) performing photolithography on a source doping region with a photoresist and the gate as a mask, and forming a highly-doped source region via an ion implantation;

(5) performing photolithography on a drain doping region with a photoresist and the gate as the mask, forming a highly-doped drain region via an ion implantation, and activating the doped impurities via a rapid thermal annealing at a high-temperature;

(6) performing photolithography on the source metal region, sputtering a metal layer, and forming a compound of a metal and semiconductor via an annealing at a low temperature, and then removing an unreacted metal and forming a Schottky source region;

(7) implementing a conventional post CMOS process, including depositing a passivation layer, opening a contact hole and metallizing, thereby obtaining the MOS transistor.

In the above manufacturing method, the semiconductor substrate in step (1) is selected from Si substrate, Ge substrate, SiGe substrate, GaAs substrate or other binary or ternary compound semiconductor of II-VI, III-V and IV-IV group, silicon-on-insulator (SOI) substrate and germanium-on-insulator (GOI) substrate.

In the above manufacturing method, the gate dielectric layer material in the step (2) is selected from silicon dioxide, hafnium dioxide and hafnium nitride.

In the above manufacturing method, the method for growing the gate dielectric layer in the step (2) is selected from a conventional thermal oxidation, a nitriding thermal oxidation, a chemical vapor deposition and a physical vapor deposition.

In the above manufacturing method, the gate electrode layer material in step (3) is selected from doped polysilicon, cobalt and nickel, and other metal or metallic silicide.

In the above manufacturing method, the metal material in step 6) is selected from Pt, Er, Co, Ni and other metal which may form a compound with the semiconductor substrate via annealing.

The invention has following advantages and beneficial effects.

1. By using a comb-shaped gate structure, a surface potential of a channel can be more effectively controlled, so that an electrical-field intensity of a source junction may be increased by lowering a conduction band or increasing a valence band of an energy band of the channel surface, thus a band-to-band tunneling is promoted and a turn-on current is generated, thereby a limit of a conventional MOSFET subthreshold slope is overcome.

2. The structure makes a full use of comb fingers of the comb-shaped gate structure, and the turn-on is realized respectively on two sides and one edge of each comb finger by using a band-to-band tunneling mechanism and a Schottky junction tunneling mechanism. By adjusting a length of the extension gate and the number of the comb fingers, a large tunneling area is realized, the turn-on current of the device is raised greatly, and at the same time, the subthreshold slope of the device is improved.

3. A parasitic resistance of the device is lowered by introducing the a Schottky source region, and a channel region under the extension gate is depleted by strictly controlling a width of the extension gate, thus a problem of a leakage current caused by the Schottky junction is greatly decreased, and a low leakage current is realized.

4. A process method for manufacturing the device with the structure is fully compatible with a conventional MOSFET manufacturing process.

Briefly, the device according to embodiments of the present invention employs a combined-source structure and includes a Schottky Barrier and a comb-shaped gate structure, thereby a performance of the device is improved and a manufacturing method is simple. As compared with an existing MOSFET, under the same process conditions and the same active region size, a higher turn-on current, a lower leakage current and a steeper subthreshold slope is obtained. Therefore, the device according to embodiments of the present invention is hopeful to be employed in a low power consumption field, and thus has a high practical value.

In figures,

1—a semiconductor substrate
2—a gate dielectric layer
3—a gate electrode layer (wherein, 3a—a main gate, 3b—a comb-shaped extension gate)
4—a photoresist
5—a highly-doped source region
6—a highly-doped drain region
7—a Schottky source region

DETAILED DESCRIPTION OF THE EMBODIMENTS

Further illustration will now be given on the invention by examples. It should be noted that the object of the embodiments disclosed is to help to further understand the invention. However, one skilled in the art may appreciate that various substitutions and modifications can be made without departing from the spirit and scope of the invention and the appended claims. Therefore, the invention should not be limited to the embodiments disclosed; instead, the scope of the invention will be defined by the appended claims and their equivalents.

One embodiment of a manufacturing method according to the invention comprises process steps as shown in FIG. 1 to FIG. 5b.

Figure 1:
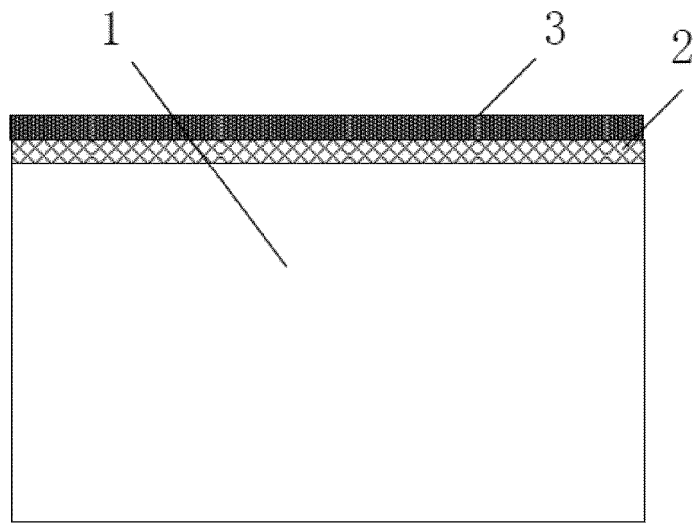
FIG. 1 is a schematic diagram showing process steps for growing a gate dielectric layer and depositing a gate electrode on a semiconductor substrate.

1. An isolation layer of an active region is formed on a bulk silicon substrate 1 with a crystal orientation of (100) via a shallow trench isolation technology, and a doping concentration of the substrate is a light doping. Then, a gate dielectric layer 2 is formed by a thermal growth, and the gate dielectric layer is $SiO_2$ with a thickness of 1-5 nm. A gate electrode layer 3 is deposited, and the gate electrode layer is a doped polysilicon layer with a thickness of 150-300 nm, as shown in FIG. 1.

Figure 2A:
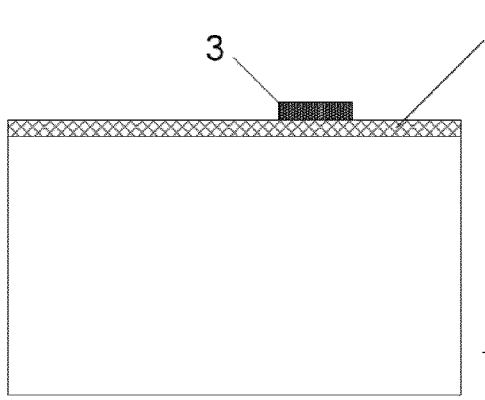
FIG. 2a is a sectional view of a device in which the gate electrode is formed after performing photolithography and etching, taken along a direction of a dashed line in FIG. 2b.
Figure 2B:
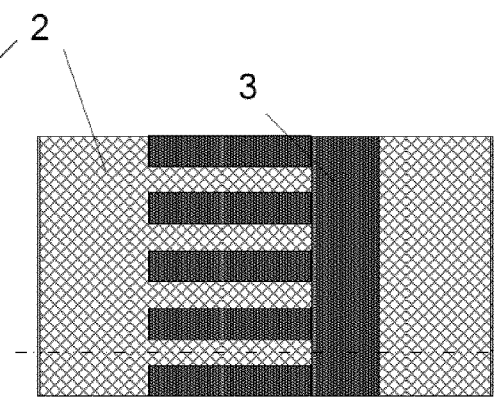
FIG. 2b is a top view of the device.

2. Photolithography is performed to form a gate pattern, which comprises a main gate 3a and a comb-shaped extension gate 3b. The gate electrode layer 3 is etched to the gate dielectric layer 2, wherein a width of each comb finger of the extension gate is 1 μm, an interval between two comb fingers is 1 μm, and the number of the comb finger is 5, as shown in FIGS. 2a and 2b.

Figure 3A:
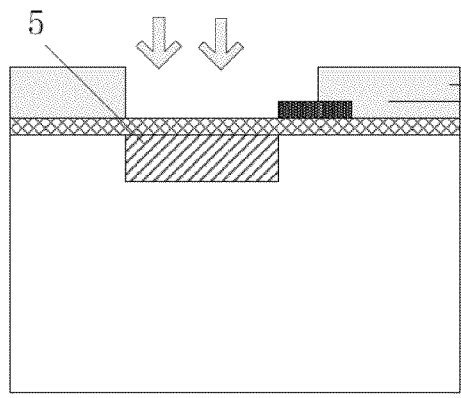
FIG. 3a is a sectional view of the device after performing photolithography on the source doping area and forming a highly-doped source region via ion implantation, taken along a direction of a dashed line in FIG. 3b.
Figure 3B:
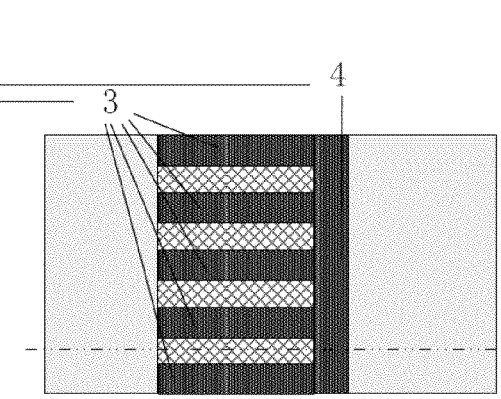
FIG. 3b is a top view of the device.

3. Photolithography is performed to form a pattern of a source doping area, and a distance from a left side of the main gate to a right side of the source doped-region is 0-1 μm; an ion implantation for the source is performed with a photoresist 4 as a mask, so as to form a highly-doped source region 5, wherein an energy of the ion implantation is 40 keV, and implanted impurities are $BF_2^+$, as shown in FIGS. 3a and 3b.

Figures 4A, 4B:
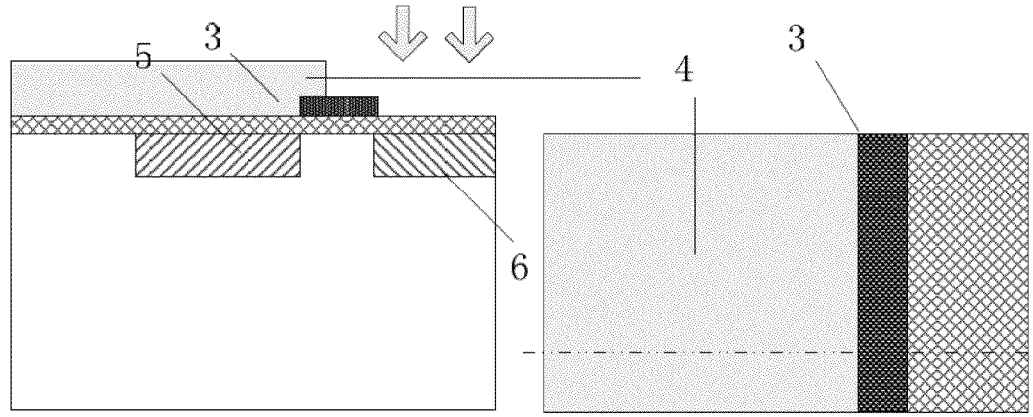
FIG. 4a is a sectional view of the device after performing photolithography on the drain doping area and forming a highly-doped drain region via ion implantation, taken along a direction of a dashed line in FIG. 4b.
FIG. 4b is a top view of the device.

4. Photolithography is performed to form a pattern of a drain doping region, an ion implantation for the drain is performed with a photoresist as a mask, so as to form a highly-doped drain region 6, wherein an energy of the ion implantation is 50 keV, and implanted impurity are $As^+$, as shown in FIGS. 4a and 4b. A rapid high-temperature annealing process is performed, and the impurities doped in the source and drain are activated.

Figures 5A, 5B:
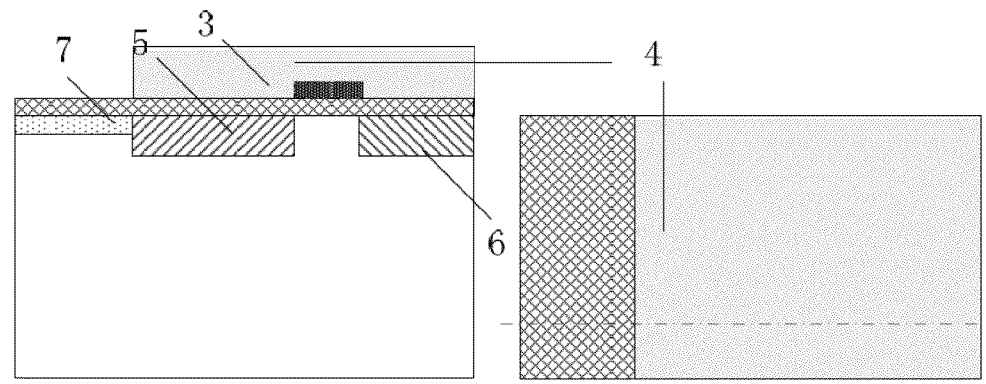
FIG. 5a is a sectional view of the device after performing photolithography on a Schottky source region and forming a silicide by sputtering a metal and annealing, taken along a direction of a dashed line in FIG. 5b.
FIG. 5b is a top view of the device.

5. Photolithography is performed to form a pattern of a metal region for the source, a metal layer Ni is sputtered with a photoresist as a mask (or, a passivation layer may be grown first, and then photolithography is performed and a region of a pattern of the metal region is etched), and the metal layer Ni is reacted with the silicon to form a metal silicide as the Schottky source region 7 of the device via thermal annealing at low temperature: as shown in FIGS. 5a and 5b.

Figure 6:
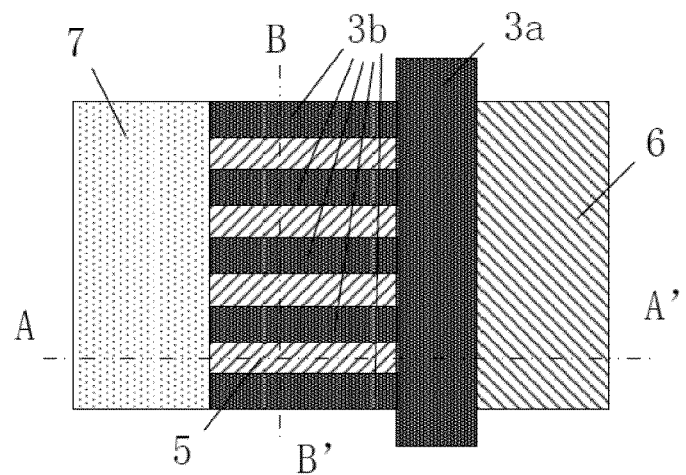
FIG. 6 is a top view of a combined-source transistor device with a comb-shaped gate structure according to the embodiments of the invention.
Figures 7A, 7B:
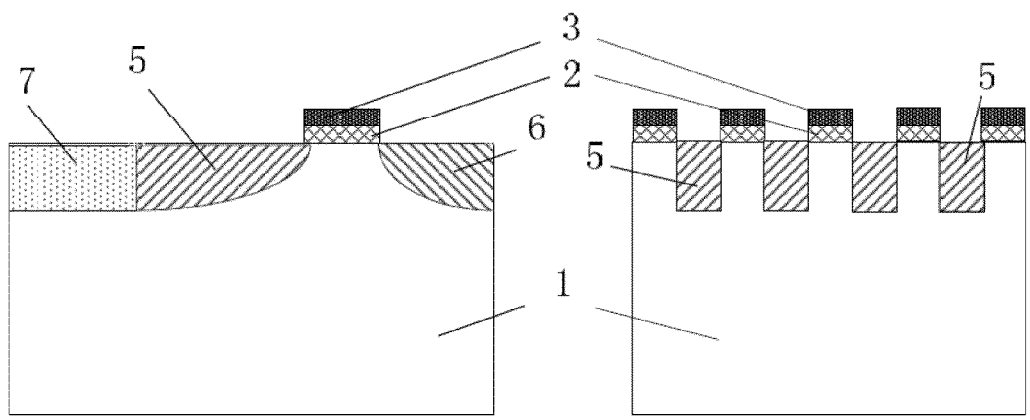
FIG. 7a is a sectional view of the transistor according to the embodiments of the invention, taken along a direction AA' in FIG. 6.
FIG. 7b is a sectional view of the transistor according to the embodiments of the invention, taken along a direction BB' in FIG. 6.

Finally, it proceeds to conventional subsequent CMOS processes, including depositing a passivation layer, opening a contact hole and metallizing, thereby a combined-source MOS transistor with an comb-shaped gate structure may be obtained, as shown in FIG. 6 and FIG. 7.

Although the invention has been disclosed by the above preferred embodiment, it will not limit the scope of the invention. Various variations and modifications can be made on the technical solutions of the invention by those skilled in the art using the above disclosed method and technical contents, without departing from the scope of the technical solution of the invention. Therefore, any simple alterations, equivalent variations and modifications on the above embodiment according to the technical essence of the invention, without departing from the technical solutions of the invention, all pertain to the protection scope of the technical solutions of the invention.

What is claimed is:

1. A combined-source MOS transistor, characterized in that, comprising: a control gate electrode layer, a gate dielectric layer, a semiconductor substrate, a highly-doped source region and a highly-doped drain region, wherein a Schottky source region is connected to a side of the highly-doped source region which is far from a channel, one end of the control gate extends to the highly-doped source region, the extended gate region is an extension gate in a form of a comb shape and the original control gate region is a main gate; an active region covered by the extension gate is also a channel region, and is a substrate material; the highly-doped source region which is formed by highly doping is located on both sides of each comb finger of the extension gate; the Schottky source region is formed by a metal or a metal silicide, and a Schottky junction is formed at a location where the Schottky source region and the channel under the extension gate are located; the highly-doped drain region is formed by highly-doped semiconductor material with a doping type which is opposite to that of the highly-doped source region and is located on a side of the control gate which is not extended.

2. The combined-source MOS transistor according to claim 1, wherein a width of each comb finger of the extension gate ranges from 1 μm to 2 μm.

3. The combined-source MOS transistor according to claim 1, wherein an interval between two adjacent comb fingers ranges from 0.5 μm to 3 μm.

4. The combined-source MOS transistor according to claim 1, wherein the extension gate occupies 1/10-5/10 of a length of the active region in a length direction.

5. The combined-source MOS transistor according to claim 1, wherein the Schottky source region is a Schottky source region with dopant segregation, which is formed by using a Post-Silicide technology in which a silicide is first formed and then impurities are implanted into the silicide; for an n-type device, the implanted impurities are phosphorus, and for a p-type device, the implanted impurities are boron; and an implanted dosage ranges from 5e14 to 5e15.

6. A method for manufacturing a combined-source MOS transistor, comprising steps of:
    (1) defining an active region on a semiconductor substrate via a shallow trench isolation;
    (2) growing a gate dielectric layer;
    (3) depositing a gate electrode layer, then performing photolithography and etching on the gate electrode layer to form patterns of a main gate and a comb-shaped extension gate;
    (4) performing photolithography on a source doping region with a photoresist and the gate as a mask, and forming a highly-doped source region via an ion implantation;
    (5) performing photolithography on a drain doping region with a photoresist and the gate as the mask, forming a highly-doped drain region via an ion implantation, and activating doped impurities via a rapid thermal annealing at a high-temperature;
    (6) performing photolithography on the source metal region, sputtering a metal layer, and forming a compound of a metal and semiconductor via an annealing at a low temperature, and then removing an unreacted metal and forming a Schottky source region;
    (7) implementing a conventional post CMOS process, comprising depositing a passivation layer, opening a contact hole and metallizing, thereby obtaining the MOS transistor according to claim 1.

7. The method according to claim 6, wherein, the semiconductor substrate in step (1) is selected from Si substrate, Ge substrate, SiGe substrate, GaAs substrate or other binary or ternary compound semiconductor of II-VI, III-V and IV-IV group, silicon-on-insulator substrate and germanium-on-insulator substrate.

8. The method according to claim 6, wherein the gate dielectric layer material in step (2) is selected from silicon dioxide, hafnium dioxide and hafnium nitride, and a method for growing the gate dielectric layer is selected from a conventional thermal oxidation, a nitriding thermal oxidation, a chemical vapor deposition and a physical vapor deposition.

9. The method according to claim 6, wherein the gate electrode layer material in step (3) is selected from doped polysilicon, cobalt and nickel, and other metal or metallic silicide.

10. The method according to claim 6, wherein the metal material in step 6) is selected from Pt, Er, Co, Ni and other metals which is able to form a compound with the substrate via annealing.

* * * * *